United States Patent
Mori

(10) Patent No.: US 8,080,850 B2
(45) Date of Patent: *Dec. 20, 2011

(54) SEMICONDUCTOR DEVICE HAVING SEMICONDUCTOR LAYER ON INSULATING STRUCTURE AND METHOD OF MANUFACTURING THE SAME

(75) Inventor: Shigeru Mori, Tokyo (JP)

(73) Assignees: NEC Corporation, Tokyo (JP); NEC LCD Technologies, Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/841,253

(22) Filed: Jul. 22, 2010

(65) Prior Publication Data

US 2010/0283106 A1      Nov. 11, 2010

Related U.S. Application Data

(62) Division of application No. 11/727,971, filed on Mar. 29, 2007, now Pat. No. 7,772,645.

(30) Foreign Application Priority Data

Mar. 31, 2006   (JP) .................................. 2006-101140

(51) Int. Cl.
   *H01L 29/76* (2006.01)
(52) U.S. Cl. ................. 257/347; 257/349; 257/E27.112
(58) Field of Classification Search .................. 257/347, 257/349, E27.112
   See application file for complete search history.

(56) References Cited

U.S. PATENT DOCUMENTS

| | | | |
|---|---|---|---|
| 5,066,993 A | 11/1991 | Miura et al. | |
| 5,360,752 A | 11/1994 | Brady et al. | |
| 6,071,791 A | 6/2000 | Hughes et al. | |
| 6,326,642 B1 * | 12/2001 | Yamazaki et al. | 257/59 |
| 6,337,500 B1 | 1/2002 | Nakaoka et al. | |
| 6,583,440 B2 * | 6/2003 | Yasukawa | 257/59 |
| 6,784,494 B2 * | 8/2004 | Mitani | 257/347 |
| 6,838,397 B2 * | 1/2005 | Takayama et al. | 438/792 |
| 6,849,872 B1 * | 2/2005 | Yamazaki et al. | 257/66 |
| 6,956,237 B2 | 10/2005 | Oh et al. | |
| 7,122,863 B1 | 10/2006 | Ju et al. | |
| 7,183,172 B2 * | 2/2007 | Lee et al. | 438/407 |
| 7,524,710 B2 | 4/2009 | Miscione et al. | |
| 7,772,645 B2 * | 8/2010 | Mori | 257/347 |
| 2003/0020118 A1 * | 1/2003 | Kajiwara et al. | 257/347 |
| 2003/0075761 A1 * | 4/2003 | Koyama et al. | 257/347 |
| 2004/0124451 A1 | 7/2004 | Oh et al. | |
| 2005/0173763 A1 * | 8/2005 | Takeguchi et al. | 257/347 |

FOREIGN PATENT DOCUMENTS

| | | |
|---|---|---|
| CN | 1512248 | 7/2004 |
| JP | 5-203982 | 8/1993 |
| JP | 2005-340280 | 12/2005 |

OTHER PUBLICATIONS

Chinese Patent Office issued a Chinese Office Action dated May 15, 2009, Application No. 2007100906529.

* cited by examiner

*Primary Examiner* — Eugene Lee
(74) *Attorney, Agent, or Firm* — Young & Thompson

(57) ABSTRACT

A semiconductor device in which a semiconductor layer is formed on an insulating substrate with a front-end insulating layer interposed between the semiconductor layer and the insulating substrate is provided which is capable of preventing action of an impurity contained in the insulating substrate on the semiconductor layer and of improving reliability of the semiconductor device. In a TFT (Thin Film Transistor), boron is made to be contained in a region located about 100 nm or less apart from a surface of the insulating substrate so that boron concentration decreases at an average rate being about $\frac{1}{1000}$-fold per 1 nm from the surface of the insulating substrate toward the semiconductor layer.

17 Claims, 7 Drawing Sheets

Average Rate of Decrease of Boron Concentration (per nm)

Average Rate of Decrease of Aluminum Concentration (per nm)

SEMICONDUCTOR DEVICE HAVING SEMICONDUCTOR LAYER ON INSULATING STRUCTURE AND METHOD OF MANUFACTURING THE SAME

BACKGROUND OF THE INVENTION

1. Field of the Invention

The present invention relates to a semiconductor device and a method for manufacturing the same and more particularly to the semiconductor device in which a semiconductor layer is formed with a front-end insulating layer interposed between the semiconductor layer and an insulating substrate.

The present application claims priority of Japanese Patent Application No. 2006-101140 filed on Mar. 31, 2006, which is hereby incorporated by reference.

2. Description of the Related Art

For example, in an LCD (Liquid Crystal Display) device known as a representative display device, an active-matrix substrate on which a TFT (Thin Film Transistor) is formed is used as a driving device for a liquid crystal element. In the TFT, a semiconductor layer made of an amorphous silicon film, polycrystalline silicon film, or a like formed on an insulating substrate is employed as its active layer in which active regions such as a source region and a drain region are formed. Due to diversification of use of LCDs in recent years, it is required that the TFT to be used is multi-functional, scaled down, and made fine and further has a high reliability and/or high endurance.

As an insulating substrate for a TFT, a glass substrate is employed which is advantageous in terms of manufacturing costs, however, mixture of some kinds of impurities into the glass substrate at a stage of manufacturing is unavoidable to facilitate easy manufacturing and processing of the glass substrate. However, these impurities act on the semiconductor layer serving as an active region of the TFT and have such a bad effect as causes a change in threshold value which is an important factor of characteristics of the TFT, thus resulting in degradation of reliability of the TFT. Even a very small amount of boron or aluminum in particular mixed as such impurities therein exerts much influence on the characteristics of the TFT. To avoid this, prior to a process of forming the semiconductor layer on the glass substrate, a cleaning process is performed on the glass substrate, however, complete removal of these impurities is impossible.

A conventional TFT is disclosed in Patent Reference 1 (Japanese Patent Application Laid-open No. Hei 5-203982) or Patent Reference 2 (Japanese Patent Application Laid-open No. 2005-340280), which is capable of protecting a semiconductor layer against being affected by impurities contained in a glass substrate. FIG. 9 is a cross-sectional view of the conventional TFT disclosed, for example, in the Patent Reference 1. The conventional TFT 100, as shown in FIG. 9, includes an insulating substrate 101, a front-end insulating layer 102 formed on the insulating substrate 101, a semiconductor layer 103 formed on the front-end insulating layer 102, a source region 104 formed in one end of the semiconductor layer 102, a drain region 105 formed in another end of the semiconductor layer 102, a gate insulating film 106 formed on the semiconductor layer 103, a gate electrode 107 formed on the gate insulating film 106, an interlayer insulating film 108 formed on all surfaces thereof including a surface of the gate electrode 107, a source electrode 111 formed so as to be in contact with the source region 104 via a contact hole 109 obtained by forming a hole through the interlayer insulating film 108 formed on all surfaces thereof including a surface of the gate electrode 107, and a drain electrode 112 also formed so as to be in contact with the drain region 112 via a contact hole 110 obtained by forming a hole through the interlayer insulating film 108.

According to the conventional TFT 100 having the configurations described above, the semiconductor layer 103 is formed with the front-end insulating layer 102 interposed between the semiconductor layer 103 and the insulating substrate 101 and, therefore, invasion of impurities into the semiconductor layer 103 is blocked and action of the impurities on the semiconductor layer 103 is suppressed. As a result, a change in threshold value of the TFT can be prevented.

However, the conventional TFT disclosed in the Patent Reference 1 has a problem. That is, even if the front-end insulating layer 102 is interposed between the semiconductor layer 103 and the insulating substrate 101, when various heat treatment processes are performed at stages of manufacturing the TFTs, impurities contained in the insulating substrate 101 are diffused, due to the heat treatment, into the front-end insulating layer 102 and the diffused impurities act on the semiconductor layer 103. In other words, in order to form, for example, the source region 104 and drain region 105, phosphorus (N-type impurity), boron (P-type impurity), or a like is implanted into the semiconductor layer 103 and, after that, processes to perform heat treatment at a comparatively high temperature of 300° C. or more such as an activating process to activate such impurities are repeated. As a result, if the insulating substrate 101 on which the semiconductor layer 103 is formed with the front-end insulating film 102 interposed between the semiconductor layer 103 and insulating substrate 101 is exposed to heat generated by the heat treatment for a long time, boron or aluminum diffuses from the insulating substrate 101 into the front-end insulating layer 102.

Then, when boron or aluminum diffuses into the front-end insulating layer 102 and gets near the semiconductor layer 103, characteristics of the TFT are made to change. There is a possibility that this phenomenon occurs due to action of boron or aluminum as a fixed charge in the front-end insulating layer 102. Boron or aluminum acts, when diffusing through the front-end insulating layer 102 and then reaching the semiconductor layer 103, as an acceptor and, as a result, a change in threshold value of the TFT occurs. This phenomenon becomes remarkable when the impurity has reached a neighboring portion of the semiconductor layer 103 located immediately below the gate electrode 107 or neighboring regions of the semiconductor layer 103 having an LDD (Lightly Doped Drain) structure or the semiconductor layer 103 having the LDD structure.

One possible method to solve the above problem is to lower temperatures to be used for heat treatment during the activating process described above to suppress the diffusion of boron or aluminum from the insulating substrate 101 into the front-end insulating layer 102. However, to lower the temperatures used for heat treatment during the activating processes leads to a failure in achieving its original purpose of the heat treatment, which causes negative factors such as a decrease in an activation rate, a breakdown voltage of gate insulating film, or a like. Therefore, even if the front-end insulating layer 102 is formed on the insulating substrate 101 as in the case of the TFT disclosed in the Patent References 1 and 2, it is impossible to avoid degradation in reliability of the TFT.

SUMMARY OF THE INVENTION

In view of the above, it is an object of the present invention to provide a semiconductor device having a semiconductor layer formed on an insulating substrate with a front-end insulating layer interposed between the semiconductor layer and the insulating substrate which is capable of preventing an impurity contained in the insulating substrate from acting on the semiconductor layer so that reliability of the semiconductor device is improved.

According to a first aspect of the present invention, there is provided a semiconductor device including:

a semiconductor layer formed on an insulating substrate with a front-end insulating layer interposed between the semiconductor layer and the insulating substrate, wherein an impurity is contained in the front-end insulating layer so that impurity concentration decreases at an average rate being about $1/1000$-fold or less per 1 nm from a surface of the insulating substrate toward the semiconductor layer.

In the foregoing, a preferable mode is one wherein a region of the front-end insulating layer where the impurity concentration decreases at the average rate being about $1/1000$-fold or less per 1 nm from the surface of the insulating substrate toward the semiconductor layer is a region located about 100 nm or less from the surface of the insulating substrate.

Also, a preferable mode is one wherein the impurity concentration in the region of the front-end insulating layer located about 100 nm or more apart from the surface of the insulating substrate is about $10^{19}$ (atom/cm$^3$) or less.

Also, a preferable mode is one wherein the region of the front-end insulating layer where the impurity concentration decreases at the average rate being about $1/1000$-fold or less per 1 nm from the surface of the insulating substrate toward the semiconductor layer is formed at least under a gate electrode.

Also, a preferable mode is one wherein the impurity is boron, aluminum, a substance containing boron, or substance containing aluminum.

Also, a preferable mode is one wherein the impurity is boron or the substance containing boron which is contained in the front-end insulating layer so that boron concentration decreases at an average rate being about $1/10000$-fold to about $1/1000$-fold per 1 nm.

Also, a preferable mode is one wherein the impurity is aluminum or the substance containing aluminum which is contained in the front-end insulating layer so that aluminum concentration decreases at an average rate being about $1/10000$-fold to about $1/1000$-fold per 1 nm.

Furthermore, a preferable mode is one wherein the boron concentration or the aluminum concentration is calculated by secondary ion mass spectroscopy.

According to a second aspect of the present invention, there is provided a method for manufacturing a semiconductor device in which a semiconductor layer is formed on an insulating substrate with a front-end insulating layer being interposed between the semiconductor layer and the insulating substrate, the method including:

a process of forming the front-end insulating layer on the insulating substrate in which impurity concentration decreases at an average rate being about $1/1000$-fold or less per 1 nm from a surface of the insulating substrate toward the semiconductor layer.

In the foregoing, a preferable mode is one that wherein includes a process of forming the region of the front-end insulating layer in which the impurity concentration decreases at the average rate being about $1/1000$-fold or less per 1 nm from the surface of the insulating substrate toward the semiconductor layer in a region located about 100 nm or less apart from a surface of the insulating substrate.

Also, a preferable mode is one that wherein includes a process of controlling so that the impurity concentration in the region of the front-end insulating layer located about 100 nm or more apart from the surface of the insulating substrate is about $10^{19}$ (atom/cm$^3$) or less.

Also, a preferable mode is one that wherein includes a process of forming the region of the front-end insulating layer in which the impurity concentration decreases at the average rate being about $1/1000$-fold or less per 1 nm from the surface of the insulating substrate toward the semiconductor layer at least under a gate electrode.

Also, a preferable mode is one that wherein includes a process of making boron, aluminum, a substance containing boron, or substance containing aluminum be contained as the impurity.

Also, a preferable mode is one that wherein includes a process of making boron or a substance containing boron be contained in the front-end insulating layer so that boron concentration decreases at an average rate being about $1/100000$-fold to about $1/1000$-fold per 1 nm.

Also, a preferable mode is one that wherein includes a process of making aluminum or a substance containing aluminum be contained in the front-end insulating layer so that boron concentration decreases at an average rate being about $1/100000$-fold to about $1/1000$-fold per 1 nm.

Furthermore, a preferable mode is one wherein the boron concentration or the aluminum concentration is calculated by secondary ion mass spectroscopy.

According to a second aspect of the present invention, there is provided a semiconductor device including:

semiconductor layer formed on an insulating substrate with a front-end insulating layer being interposed between the semiconductor layer and the insulating substrate, wherein an impurity is contained in the front-end insulating layer located about 100 nm or less from the surface of the insulating substrate, so that impurity concentration decreases at an average rate being about $1/1000$-fold or less per 1 nm from a surface of the insulating substrate toward the semiconductor layer, and wherein the impurity concentration in the region of the front-end insulating layer located about 100 nm or more apart from the surface of the insulating substrate is about $10^{19}$ (atom/cm$^3$) or less.

With the above configuration, boron or aluminum is contained in the front-end layer in impurity concentration to a degree that the semiconductor layer formed on the front-end layer is not affected and, therefore, action of boron or aluminum contained in the insulating substrate on the semiconductor layer can be prevented, thus improving reliability of the semiconductor device.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings. In the semiconductor device in which a semiconductor layer is formed with a front-end insulating layer interposed between the semiconductor layer and an insulating substrate, boron is contained in a region located about 100 nm or less apart from a surface of the insulating substrate in the front-end insulating layer so that boron concentration decreases at an average rate being about $1/10000$-fold to about $1/1000$-fold per 1 nm from the surface of the insulating substrate toward the semiconductor layer.

Principles of the Invention

As a result of earnest researches, the inventors of the present invention have been found that, even when boron or aluminum is implanted in a front-end insulating layer formed on an insulating substrate, by exerting a control so that concentration of such an impurity as boron or aluminum decreases at a specified average rate from the insulating substrate toward the semiconductor layer, a threshold value of a TFT is not affected by boron or aluminum implanted in the front-end insulating layer.

Figure 6:
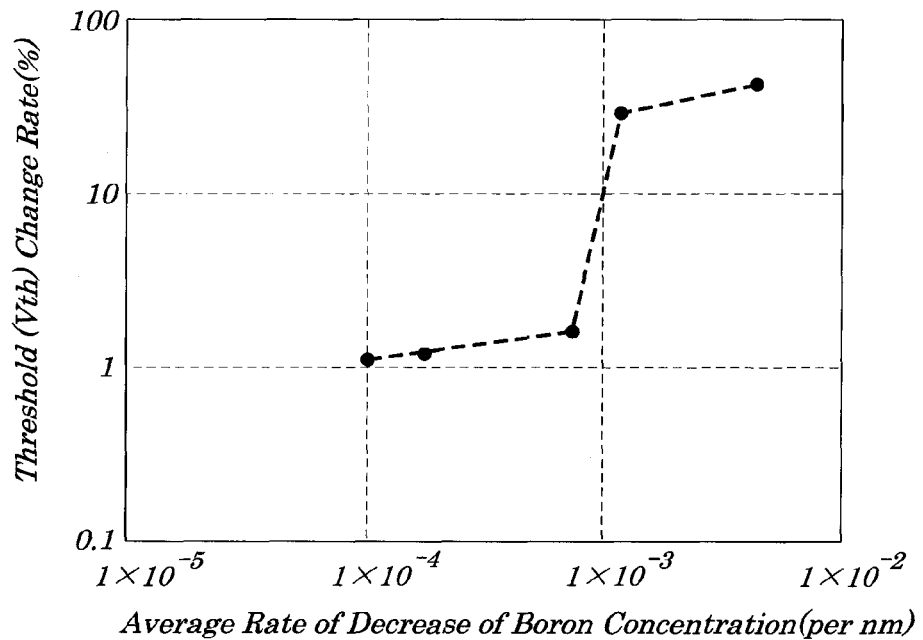
FIG. 6 is a diagram explaining principles of the present invention and shows a relation between a threshold (Vth) change rate (ordinate) and an average rate of a decrease in boron concentration per 1 nm (abscissa)

FIG. 6 is a diagram explaining principles of the present invention and shows a relation between a threshold (Vth) change rate (ordinate) and an average rate of a decrease in boron concentration (abscissa), both data obtained under conditions that a P-channel TFT formed on an insulating substrate with its channel length and its channel width both being 5 μm, its LDD length being 1.2 μm on an insulating substrate is used and a negative gate stress is applied by supplying a voltage (Vgs=−18V) between a gate and source in a state that the TFT is exposed in an atmosphere of high temperature being 60° C. and humidity being 90°. That is, the average rate of the decrease in the concentration of boron implanted into the front-end insulating layer from a surface of the insulating substrate to the semiconductor layer is plotted as abscissa, which shows how the Vth change rate is changed when the average rate of the decrease is larger than the rate being $1/100$-fold per 1 nm.

The above rate denotes a rate obtained by dividing a concentration of boron or aluminum at a position of the front-end insulating layer by a concentration of boron or aluminum at a surface of a glass substrate. Also, the average rate of the decrease denotes a rate obtaining by converting the rate at which the boron or aluminum concentration decreases to a unit film thickness and, if a front-end insulating film is made up of two or more different insulating films, the two insulating films are regarded as one insulating film for the conversion. For example, if the concentration of boron or aluminum contained in the front-end layer with a thickness of 100 nm is $1/100000$-fold, the average rate of the decrease in concentration is $1/1000$-fold per 1 nm.

Figure 7:
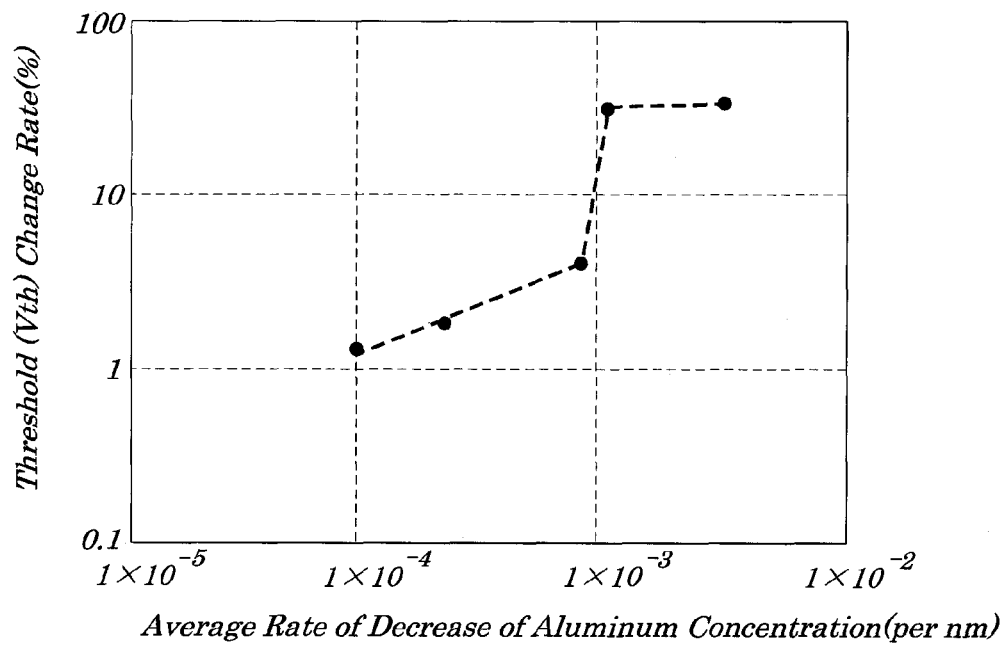
FIG. 7 is also a diagram explaining principles of the present invention and shows a relation between a threshold (Vth) change rate (ordinate) and an average rate of a decrease in aluminum concentration per 1 nm (abscissa)

FIG. 7 is also a diagram explaining principles of the present invention and shows a relation between a threshold (Vth) change rate (ordinate) and an average rate of a decrease in aluminum concentration per 1 nm (abscissa) both data being obtained under conditions that a P-channel TFT formed on an insulating substrate with the same specifications as above is used and the same conditions as above are applied, which shows how the Vth change rate is changed when the average rate of the decrease is larger than the rate being $1/100$-fold per 1 nm.

Figure 8:
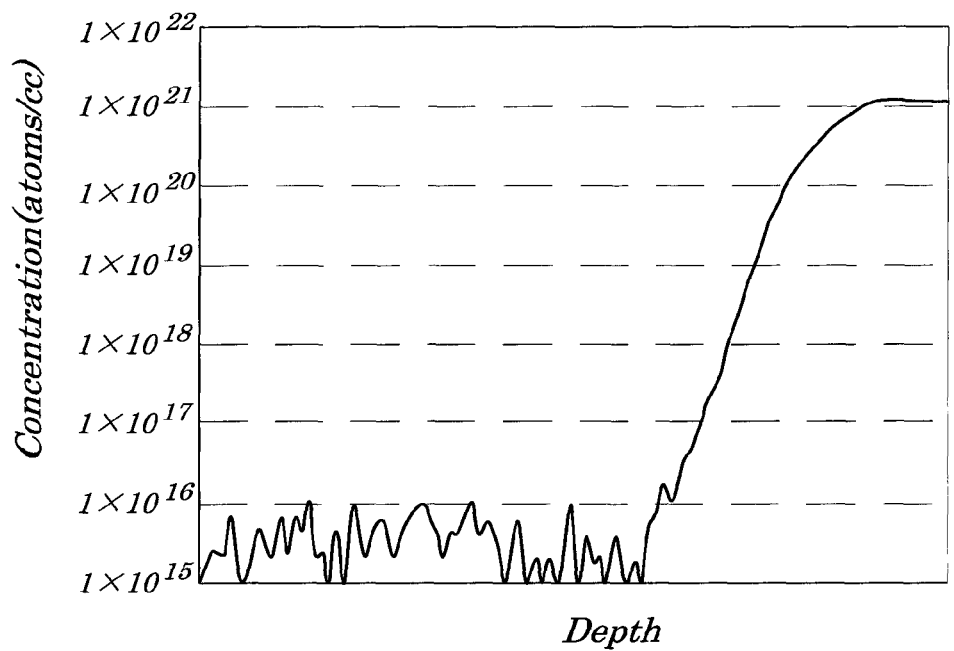
FIG. 8 is a graph of a distribution of impurity concentration detected by secondary ion mass spectroscopy based on the principles of the present invention and shows a relation between impurity concentration (ordinate) and depth (abscissa)
Figure 9:
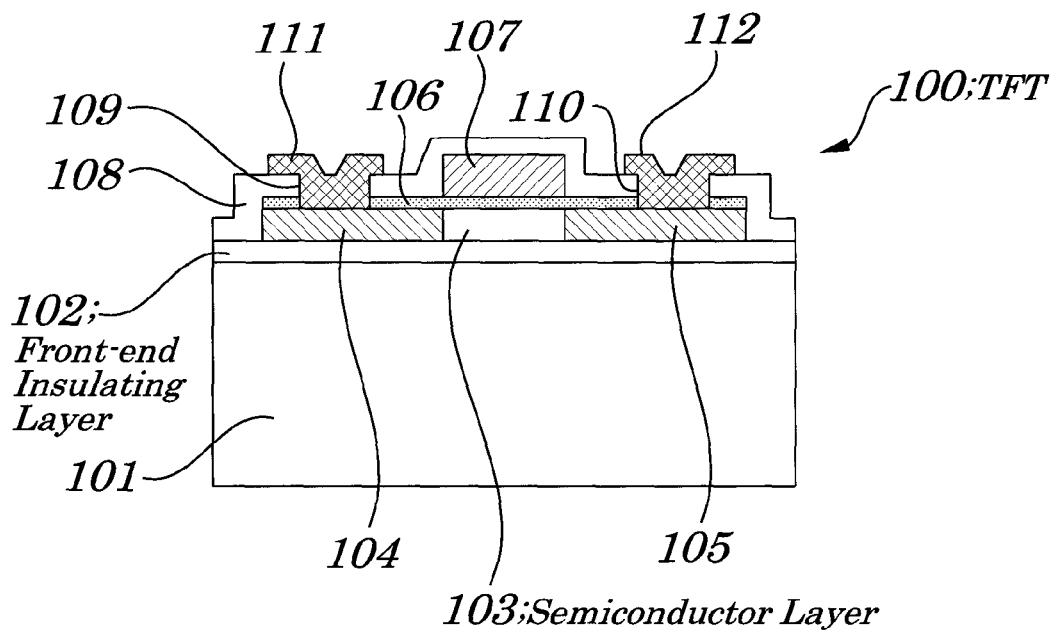
FIG. 9 is a cross-sectional view of a conventional TFT.

Boron concentration or aluminum concentration can be easily calculated by the impurity concentration distribution graph, as shown in FIG. 8, using data obtained by secondary ion mass spectroscopy. In FIG. 8, a relation between impurity concentration (ordinate) and depth (abscissa) is shown. The boron concentration shown in FIG. 6 is calculated by using the secondary ion mass spectroscopy in which an oxygen plasma ion is used as a primary ion and an accelerated voltage of the primary ion is set to be 5 keV. The concentration to be detected is based on a simple boron or a substance (compound) containing boron in a front-end insulating layer. Similarly, the aluminum concentration shown in FIG. 7 is calculated by using the secondary ion mass spectroscopy in which an oxygen plasma ion is used as a primary ion and an accelerated voltage of the primary ion is set to be 5 keV. The concentration to be detected is based on simple aluminum or a substance (compound) containing aluminum in a front-end insulating layer.

In the relation between the Vth change rate (ordinate) and the average rate of the decrease in boron concentration, as shown in FIG. 6, the Vth change rate decreases rapidly in the region where the average rate of the decrease in boron concentration in the front-end insulating layer is about $1/1000$-fold per 1 nm and the Vth change rate is maintained to be sufficiently low in the region where the average rate of the decrease in the boron concentration reaches about $1/10000$-fold per 1 nm from about $1/1000$-fold per 1 nm. However, if, due to mixture of a large amount of boron at time of formation of the front-end insulating layer, the boron concentration exceeds about $1 \times 10^{19}$ (atom/cm$^3$) in a region located about 100 nm or more apart from a surface of the insulating substrate in the front-end insulating layer, the semiconductor layer is affected by boron in its neighboring portion and it is, therefore, desirous that the boron concentration in the region located about 100 nm or more apart from the surface of the insulating substrate in the front-end layer is about $1 \times 10^{19}$ (atom/cm$^3$) or less. It is needless to say that the lower the boron concentration, the better. This suggests that, by setting the boron concentration so as to decrease at the average rate being about $1/1000$-fold per 1 nm from the surface of the insulating substrate toward the semiconductor layer in the region located about 100 nm or less apart from the surface of the insulating substrate in the front-end layer, a change in a threshold value of a TFT can be suppressed. Particularly, it is preferable that the boron concentration is set so as to decrease at the rate being about $1/10000$-fold to about $1/1000$-fold per 1 nm. That is, by making the front-end insulating layer contain boron in impurity concentration to a degree that boron does not affect the semiconductor layer, action of boron contained in the insulating substrate on the semiconductor layer can be prevented and reliability of a semiconductor device can be improved.

Similarly, in the relation between the Vth change rate (ordinate) and the rate of the average decrease of aluminum concentration, as shown in FIG. 7, the Vth change rate decreases rapidly in the region where the average rate of the decrease in aluminum concentration is about $1/1000$-fold per 1 nm and the Vth change rate is maintained to be sufficiently low until the average rate of the decrease in the aluminum concentration reaches about $1/10000$-fold per 1 nm from about $1/1000$-fold per 1 nm. However, as in the case shown in FIG. 6, if, due to mixture of a large amount of aluminum at time of formation of the front-end insulating layer, if the aluminum concentration exceeds about $1\times10^{19}$ (atom/cm$^3$) in a region located about 100 nm or more apart from the surface of the insulating substrate in the front-end insulating layer, the semiconductor layer is affected by aluminum in its neighboring portion and it is, therefore, desirous that the aluminum concentration in the region located about 100 nm or more apart from the surface of the insulating substrate in the front-end layer is about $1\times10^{19}$ (atom/cm$^3$) or less. It is needless to say that the lower the aluminum concentration, the better. This suggests that, by setting the aluminum concentration so as to decrease at the average rate being about $1/1000$-fold per 1 nm from the surface of the insulating substrate toward the semiconductor layer in the region located about 100 nm or less apart from the surface of the insulating substrate in the front-end layer, the change in a threshold value of a TFT can be suppressed. Particularly, it is preferable that the boron concentration is set so as to decrease at the rate being about $1/10000$-fold to about $1/1000$-fold per 1 nm.

First Embodiment

Figure 1:
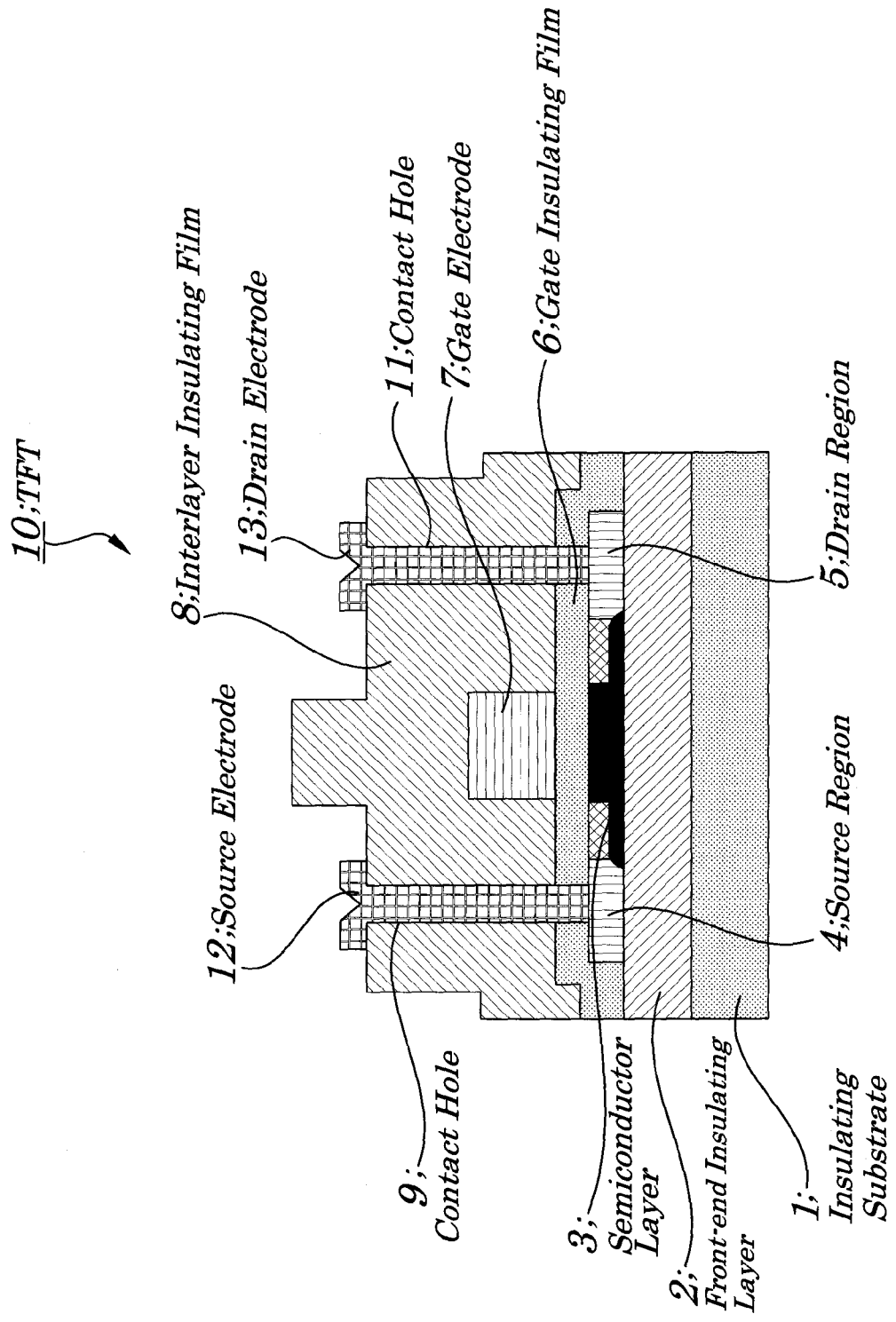
FIG. 1 is a cross-sectional view showing configurations of a semiconductor device according to a first embodiment of the present invention.

FIG. 1 is a cross-sectional view showing configurations of a semiconductor device according to a first embodiment of the present invention. FIG. 2A to FIG. 4J are diagrams illustrating a method of manufacturing the semiconductor device, in order of processes, according to the first embodiment. In the embodiment, an example in which the semiconductor device is applied to a TFT is described. The TFT (semiconductor device) 10 includes, as shown in FIG. 1, an insulating substrate 1 made of glass, a front-end insulating layer 2 made of a silicon oxide film with a film thickness of 30 nm to 100 nm formed on the insulating substrate 1, a semiconductor layer 3 made of amorphous silicon layer or polycrystalline silicon layer with a thickness of 30 nm to 100 nm formed on the front-end insulating layer 2, a source region 4 formed on one end of the semiconductor layer 3, a drain region 5 formed on another end of the semiconductor layer 3, a gate insulating film 6 made of a silicon oxide film with a film thickness of 50 nm to 300 nm formed on the semiconductor layer 2, and a gate electrode 7 made of a chromium film with a film thickness of 50 nm to 1000 nm on the gate insulating film 6. In the embodiment, as described later, the source region 4 is made up of a P-type high-concentration region 4A and a P-type low-concentration region 4B and the drain region 5 is made up of a P-type high-concentration region 5A and a P-type low-concentration region 5B, both being of an LDD (Lightly Doped Drain) structure.

Moreover, the TFT 10 also includes, as shown in FIG. 1, an interlayer insulating film 8 made of a silicon oxide film with a film thickness of 10 nm to 500 nm formed on all surfaces thereof including a surface of the gate electrode 7, a source electrode 12 made of an aluminum film with a film thickness of 30 nm to 500 nm formed so as to be in contact with the source region 4 via a contact hole 9 obtained by forming a hole in the interlayer insulating film 8, and a drain electrode 13 made of an aluminum film with a film thickness of 30 nm to 500 nm formed so as to be in contact with the drain region 5 via a contact hole 11 obtained by forming a hole in the interlayer insulating film 8.

Here, the front-end insulating layer 2, based on the principles of the present invention, is made to contain, in a region located about 100 nm or less apart from a surface of the insulating substrate 1 in the front-end insulating layer, boron the concentration of which decreases at an average rate being about $1/10000$-fold to about $1/1000$-fold per 1 nm from a surface of the insulating substrate 1 to the semiconductor layer Preferably, the boron concentration on the surface of the insulating substrate 1 is about $1\times10^{22}$ (atom/cm$^3$) or less.

As described above, according to the TFT 10 of the first embodiment, boron whose concentration decreases at an average rate being about $1/10000$-fold to about $1/1000$-fold per 1 nm from the surface of the insulating substrate 1 to the semiconductor layer 3 is contained in the region located about 100 nm or less apart from the surface of the insulating substrate 1 in the front-end insulating layer 2, based on the principles of the present invention and, therefore, the Vth change rate decreases rapidly in a region where the rate of the average decrease of the boron concentration in the front-end insulating layer 2 is about $1/1000$-fold per 1 nm and the Vth change rate is maintained to be sufficiently small until the average rate of the decrease in the boron concentration is about $1/100000$-fold per 1 nm. As a result, a change in a threshold value of the TFT 10 can be suppressed and reliability of the TFT can be improved.

Figure 2A:
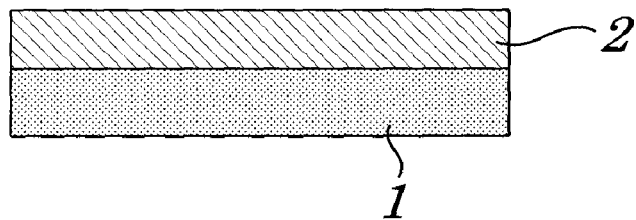
FIG. 2A to FIG. 2D are diagrams illustrating a method of manufacturing the semiconductor device in order of processes according to the first embodiment of the present invention.

Next, the method for manufacturing the TFT of the first embodiment (first manufacturing method) is explained, in order of processes, by referring to FIG. 2A to FIG. 4J. As shown in FIG. 2A, the front-end insulating layer 2 made of a silicon oxide film with a film thickness of 100 nm to 1000 nm is formed, by a plasma CVD (Chemical Vapor Deposition) using TEOS (tetraethoxysilane) or SiH$_4$ (monosilane) as material gas, on the insulating substrate 1. On the front-end insulating layer 2 is formed the semiconductor layer 3, as described later. At this time point, boron is made to be contained in a region located about 100 nm or less apart from the surface of the insulating substrate 1 in the front-end insulating layer 2 so that its concentration decreases at an average rate being about $1/10000$-fold to about $1/1000$-fold per 1 nm from the surface of the insulating substrate 1 to the semiconductor layer 3. This is achieved by controlling, when necessary, a flow rate of material gas, pressure of gas, amount of high-frequency applying power, distance between an electrode and a substrate, deposition temperature, or a like when the silicon oxide film making up the front-end insulating layer is formed by the plasma CVD method described above. These elements to be controlled vary depending on a type of a plasma CVD apparatus and it is desirous that time required for the formation is reduced as much as possible by taking production costs in consideration.

Figure 2B:
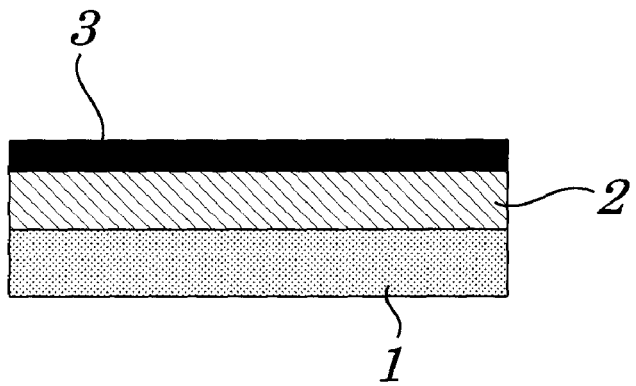

Next, as shown in FIG. 2B, the semiconductor layer 3 made of an amorphous silicon film with a film thickness of 30 nm to 100 nm is formed on the front-end insulating layer 2 by the plasma CVD method using SiH$_4$ as material gas. At the same time of deposition of the amorphous silicon film, to control a threshold value of a TFT, the semiconductor layer 3 is doped with a small amount of an impurity such as boron, phosphorus, or a like. The doping with these impurities may be performed after completion of the deposition of the amorphous silicon film. If necessary, the amorphous silicon film may be changed to be a polycrystalline silicon film by applying an excimer laser to the amorphous silicon film so that the semiconductor layer 3 made of the polycrystalline silicon film is formed. Since mobility of the polycrystalline silicon film is larger than that of the amorphous silicon film, it is made possible to obtain a TFT having high operation speed.

Figure 2C:
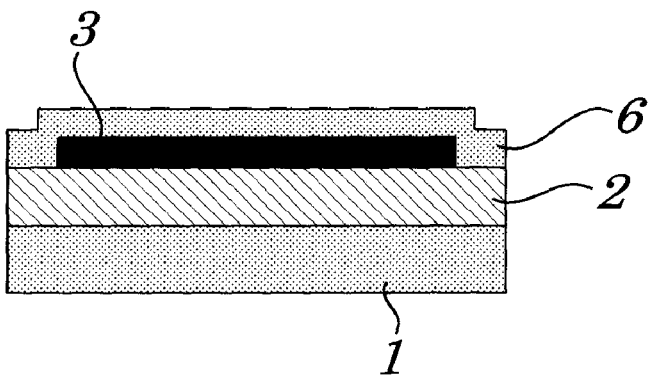

Then, as shown in FIG. 2C, after the semiconductor layer 3 is etched selectively by a photolithography method or a photo-etching method for patterning to obtain a desired shape, the gate insulating film 6 made of a silicon oxide film with a film thickness of 50 nm to 300 nm is formed, by the plasma CVD method, on the semiconductor layer 3. A silicon nitride film, instead of a silicon oxide film, may be used to form the gate insulating film 6 or a layer-stacked film of a silicon oxide film and silicon nitride film may be used as the gate insulating film 6. In order to form the gate insulating film 6, not only the plasma CVD method but also a PVD (Physical Vapor Deposition) method, a plasma oxidation method, an oxidation method using water vapor at high pressure, or methods achieved by combining these methods may be employed, however, it is preferable that these methods are performed at about 600° C. to prevent deformation of the insulating substrate 1 at time of heating.

Figure 2D:
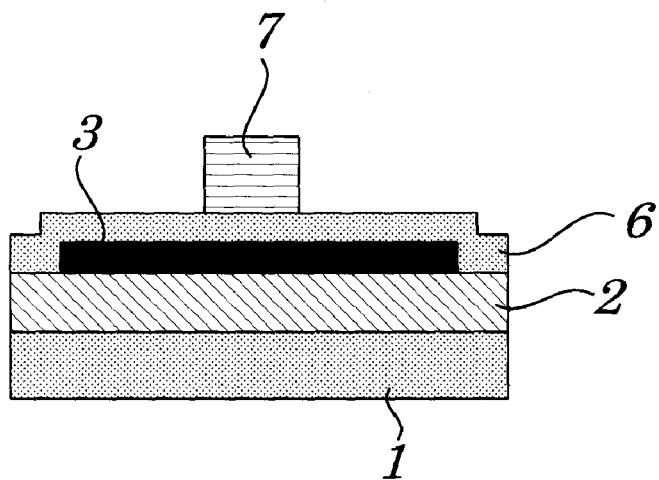

Next, as shown in FIG. 2D, a gate electrode film made of a chromium film with a film thickness of 50 nm to 1000 nm is formed on the gate insulating film 6. As the gate electrode film, instead of the chromium film, a silicon film formed by a CVD method and doped with an impurity such as boron, phosphorus, or a like may be used or a layer-stacked film of the chromium film and the silicon film may be employed. Then, the gate electrode film is etched selectively by photolithography or a photo-etching method for patterning to form the gate electrode 7.

Figure 3E:
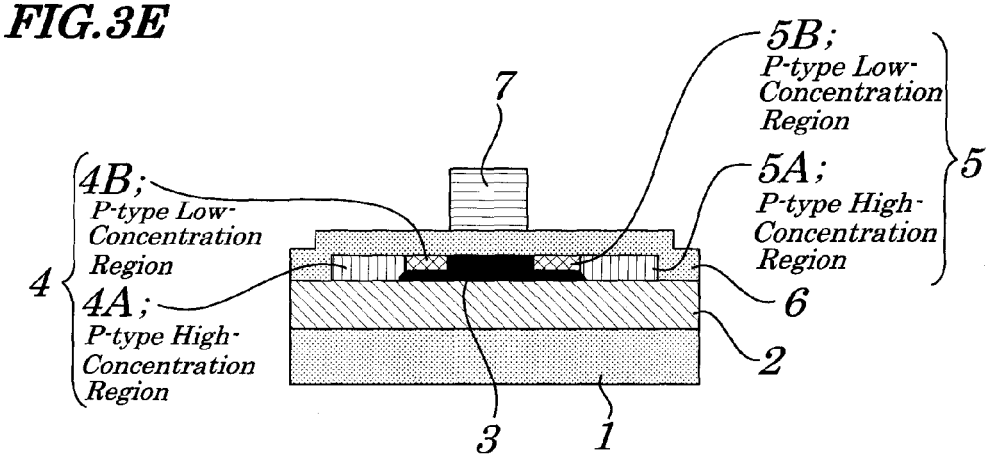
FIG. 3E to FIG. 3G are also diagrams illustrating the method of manufacturing the semiconductor device in order of processes according to the first embodiment of the present invention.

Then, after a resist pattern is formed on the gate electrode 7, as shown in FIG. 3E, the semiconductor layer 3 is doped through the gate insulating film 7 with a P-type impurity by using the resist pattern as a mask to form P-type high-concentration regions 4A and 5A. The formation of the P-type high concentration regions 4A and 5A may be performed before the formation of the gate electrode 7, however, in order to suppress deterioration of the gate insulating film 6 caused by doping with the impurity, the formation of the P-type high concentration regions 4A and 5A is preferably performed prior to the formation of the gate insulating film 6. Then, after the formation of a new resist pattern on the gate electrode 7, the semiconductor layer 3 is doped through the gate insulating film 7 with a P-type impurity by using the resist pattern as a mask to form P-type low-concentration regions 4B and 5B. Thus, a P-type source region 4 made up of the P-type high-concentration region 4A and P-type low-concentration region 4B and a P-type drain region 5 made up of the P-type high-concentration region 5A and P-type low-concentration region 5B are formed.

Figure 3F:
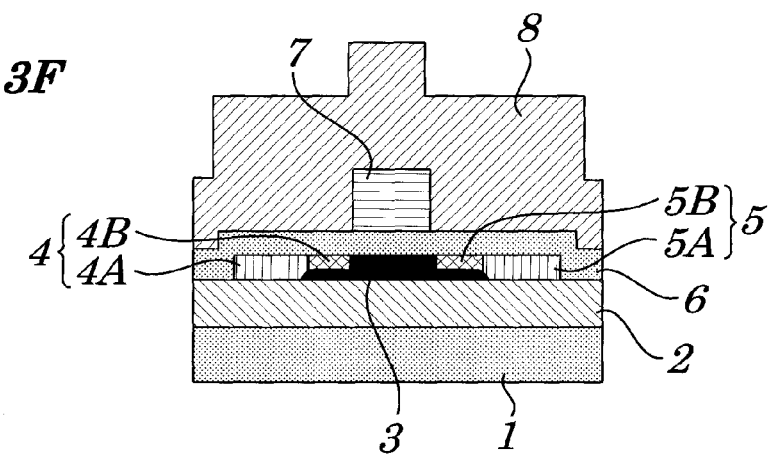

Next, as shown in FIG. 3F, the interlayer insulating film 8 made of a silicon oxide film, silicon nitride film, or layer-stacked film of the silicon oxide film and silicon nitride film with a film thickness of 10 nm to 500 nm is formed all surfaces thereof, by the plasma CDV method. The purpose of the formation of the interlayer insulating film 11 is to prevent a material used as the gate electrode 5 (in the embodiment, chromium) from being peeled when heat treatment at relatively high temperatures of 300° C. to 700° C. is performed, at a later stage, to activate the impurity contained in the source region 4 and drain region 5 having the LDD structure is performed and to ensure an insulated state between the gate electrode 7 and source electrode 12 to be formed in a later stage and between the drain electrode 13 and gate electrode 7.

Figure 3G:
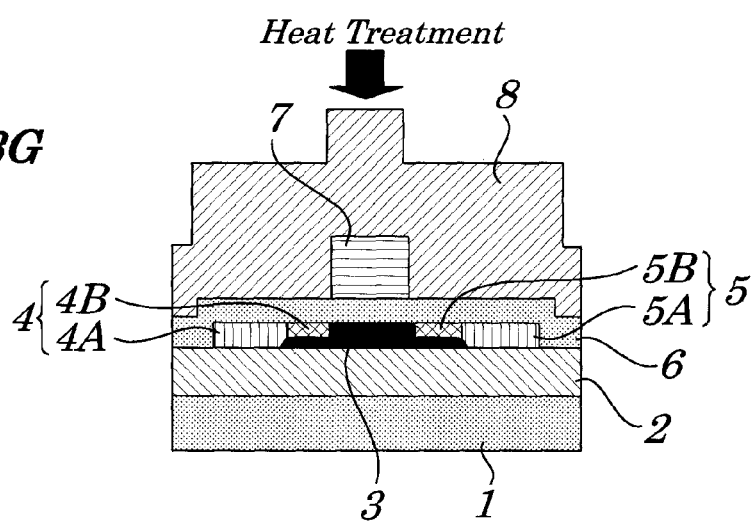

Then, as shown in FIG. 3G, impurities contained in the source region 4 and drain region 5 are activated in a heat treatment furnace at 300° C. to 700° C. The impurities may be activated by applying an excimer laser or a like instead of using the heat treatment furnace.

Figure 4H:
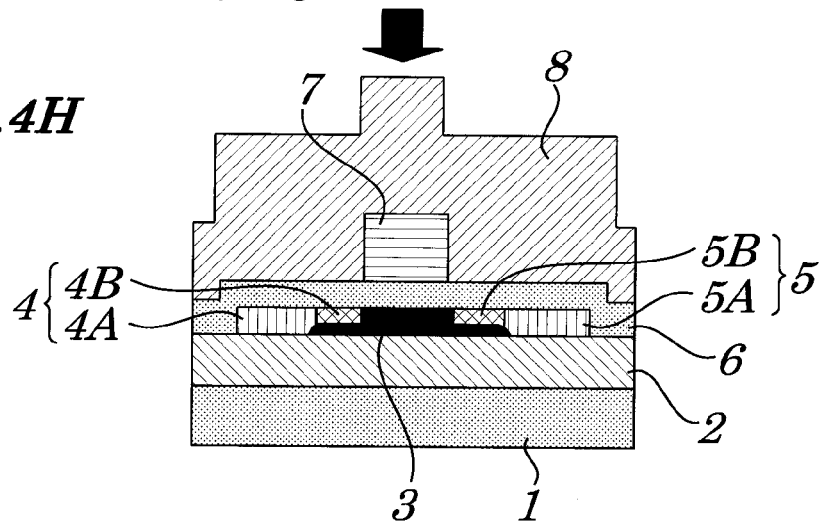
FIG. 4H to FIG. 4J are also diagrams illustrating the method of manufacturing the semiconductor device in order of processes according to the first embodiment of the present invention.

Next, as shown in FIG. 4H, to terminate a dangling bond in the semiconductor layer 3 and at an interface between the semiconductor layer 3 and gate insulating film 6, hydrogen terminating treatment is performed by heat treatment in an atmosphere of hydrogen plasma. This is done to prevent degradation of electrical characteristics of a TFT that may occur when the above dangling bond is not terminated.

Figure 4I:
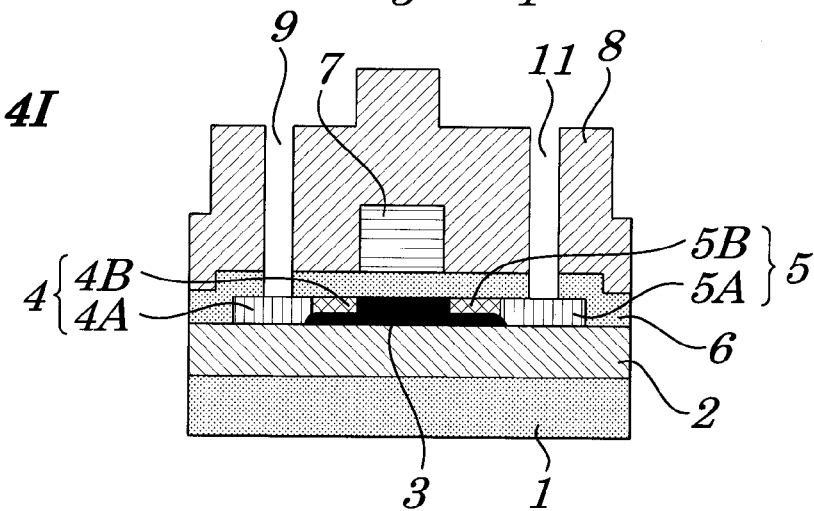

Then, as shown in FIG. 4I, the interlayer insulating film 11 and gate insulating film 7 are selectively etched by a photolithography method, photo-etching method, wet etching method or by both the photo-etching and wet etching methods to form contact holes 9 and 11 so that the source region 4 and drain region 5 are exposed.

Figure 4J:
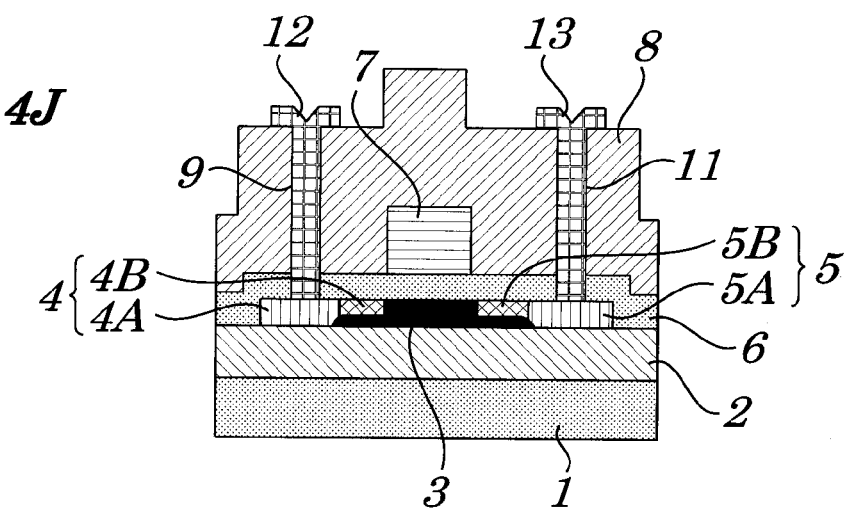

Next, as shown in FIG. 4J, after formation of an aluminum thin film on all surfaces thereof by a sputtering method, the thin film is etched by a photolithograpy method, photo-etching method, wet etching method, or both the photo-etching and wet etching methods to form the source electrode 12 and drain electrode 13 in a manner to be in contact with the source region 4 and drain region 5 respectively. Then, by removing the resist mask, the TFT 10 as shown in FIG. 1 is completed. Thereafter, if necessary, another electrode film, passivation film, interlayer insulating film, planarized film, capacitive insulating film, or a like are formed additionally.

According to the method of manufacturing the TFT 10 of the first embodiment, by combining known manufacturing processes, without using any special manufacturing process, the TFT 10 can be manufactured, which enables production of the TFT 10 without increases in manufacturing costs.

Second Embodiment

Figure 5:
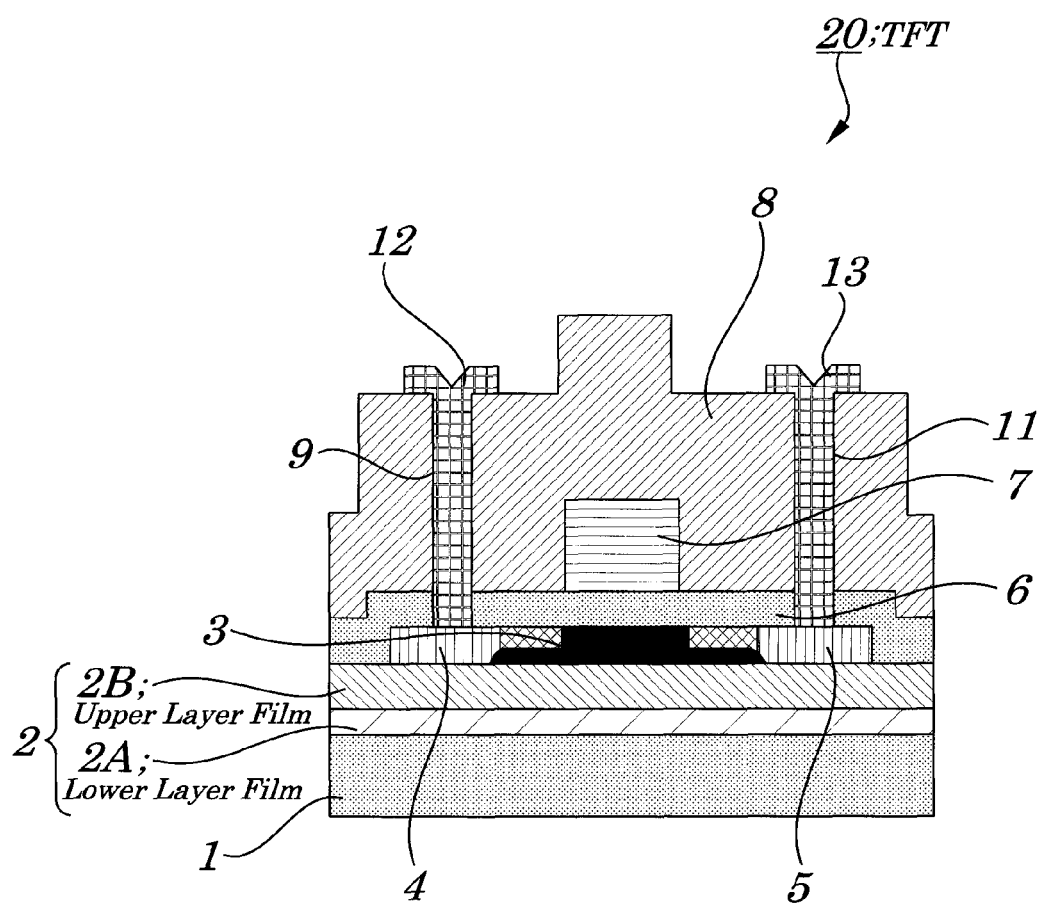
FIG. 5 is a cross-sectional view showing configurations of a semiconductor device according to a second embodiment of the present invention.

FIG. 5 is a cross-sectional view showing configurations of the semiconductor device according to the second embodiment of the present invention. Configurations of the semiconductor device of the second embodiment differ from those in the first embodiment in that a front-end insulating film is of a layer-stacked structure. The TFT 20 of the second embodiment, as shown in FIG. 5, is made up of a layer-stacked film having a lower layer film 2A made of a silicon nitride film with a film thickness of 50 nm to 100 nm and an upper layer film 2B made of a silicon oxide film with a film thickness of 50 nm to 1000 nm. The silicon nitride film has an advantage of being highly effective of blocking an impurity ion and a disadvantage of having large internal stress. Due to this, if the semiconductor layer 3 is formed directly on a silicon nitride film, distortion occurs in the semiconductor layer 3 which affects a threshold of a TFT and, therefore, the front-end insulating film 2 has a layer-stacked structure in which a silicon oxide film is formed on the silicon nitride film. The film thickness of the front-end insulating layer 2 is preferably about 100 nm or more to suppress influences to be exerted by electrical charges existing at an interface between the insulating substrate 1 and front-end insulating layer 2 on the semiconductor layer 3.

In the TFT 20 of the second embodiment, when the front-end insulating layer 2 is doped with boron, approximately the same results as shown in FIG. 6 can be obtained and when the front-end insulating layer 2 is doped with aluminum, approximately the same results as shown in FIG. 7 can be obtained.

Configurations other than described above are approximately the same as those in the first embodiment and, in FIG. 5, the same reference numbers are assigned to components having the same functions as in FIG. 1 and their descriptions are omitted accordingly.

Thus, according to the TFT of the second embodiment, except that the font-end insulating film 2 is of a layer-stacked structure, its configurations are the same as those in the first embodiment and, therefore, approximately the same effect as obtained in the first embodiment can be achieved.

Next, the method for manufacturing the TFT of the second embodiment (second manufacturing method) is explained. In the second manufacturing method, instead of the process in the first manufacturing method shown in FIG. 2A, a lower layer film 2A made of a silicon nitride film with a film thickness of 50 to 100 nm is formed by a plasma CVD using $SiH_4$, $NH_3$, and $N_2$ as material gas. Then, an upper layer film 2B made of a silicon oxide film with a film thickness of 50 nm to 100 nm is formed on the lower layer film 2A by the plasma CVD method using TEOS or $SiH_4$ as material gas.

At this time, the front-end insulating layer 2 is doped with boron in a region located about 100 nm or less apart from a surface of the insulating substrate 1 in the front-end insulating layer 2 so that the boron concentration decreases at an average rate being about $1/10000$-fold to about $1/1000$-fold per 1 nm from the surface of the insulating substrate 1 toward the semiconductor layer 3. Or, the front-end insulating layer 2 is doped with aluminum in a region located about 100 nm or less apart from the surface of the insulating substrate 1 in the front-end insulating layer 2 so that the aluminum concentration decreases at an average rate being about $1/10000$-fold to about $1/1000$-fold per 1 nm from the surface of the insulating substrate 1 toward the semiconductor layer 3. This is achieved by controlling, when necessary, a flow rate of material gas, pressure of gas, amount of high-frequency applying power, distance between an electrode and a substrate, deposition temperature, or a like when the silicon nitride film and silicon oxide film making up the front-end insulating layer 2 is formed by the plasma CVD method described above. These elements to be controlled vary depending on a type of a plasma CVD apparatus and it is desirous that time required for the formation is reduced as much as possible by taking production costs in consideration. The method other than the above are approximately the same as those in the first embodiment and, its descriptions are omitted accordingly.

According to the method of manufacturing the TFT 20 of the second embodiment as in the case of manufacturing the TFT 10 in the first embodiment, by combining known manufacturing processes, without using any special manufacturing process, the TFT 20 can be manufactured, which enables production of the TFT 20 without increases in manufacturing costs.

It is apparent that the present invention is not limited to the above embodiments but may be changed and modified without departing from the scope and spirit of the invention. For example, in the embodiment, the example is described in which both the source region and drain region of the TFT have the LDD structure, however, the present invention is not limited to this. Also, in the embodiment, the example is described in which both the source and drain regions are of a P-type conduction and the silicon oxide film is used as the gate insulating film, however, the present invention is not limited to this and a layer-stacked film made up of a silicon oxide film and silicon nitride film can be used. In the embodiment, a chromium thin film is employed as the gate electrode, however, instead of chromium, aluminum, molybdenum, tungsten, niobium, or other metal such as an alloy of these metals may be used.

What is claimed is:

1. A semiconductor device comprising:
   a semiconductor layer formed on an insulating substrate with a front-end insulating layer being interposed between said semiconductor layer and said insulating substrate, said front-end insulating layer having a lower layer insulating film and an upper layer insulating film,
   wherein an impurity is contained in said front-end insulating layer so that impurity concentration decreases at an average rate being about $1/1000$-fold or less per 1 nm from a surface of said insulating substrate toward said semiconductor layer.

2. The semiconductor device according to claim 1, wherein a region of said front-end insulating layer where said impurity concentration decreases at the average rate being about $1/1000$-fold or less per 1 nm from the surface of said insulating substrate toward said semiconductor layer is a region located about 100 nm or less from said surface of said insulating substrate.

3. The semiconductor device according to claim 2, wherein said impurity concentration in said region of said front-end insulating layer located about 100 nm or more apart from said surface of said insulating substrate is about $10^{19}$ (atom/cm)$^3$ or less.

4. The semiconductor device according to claim 1, wherein said region of said front-end insulating layer where said impurity concentration decreases at the average rate being about $1/1000$-fold or less per 1nm from the surface of said insulating substrate toward said semiconductor layer is formed at least under a gate electrode.

5. The semiconductor device according to claim 1, wherein said impurity is boron, aluminum, a substance containing boron, or substance containing aluminum.

6. The semiconductor device according to claim 1, wherein said impurity is boron or said substance containing boron which is contained in said front-end insulating layer so that boron concentration decreases at an average rate being about $1/10000$-fold to about $1/1000$-fold per 1 nm.

7. The semiconductor device according to claim 1, wherein said impurity is aluminum or said substance containing aluminum which is contained in said front-end insulating layer so that aluminum concentration decreases at an average rate being about $1/10000$-fold to about $1/1000$-fold per 1 nm.

8. The semiconductor device according to claim 5, wherein boron concentration or aluminum concentration is calculated by secondary ion mass spectroscopy.

9. The semiconductor device according to claim 1, wherein said lower layer insulating film is made of a silicon nitride film, and said upper layer insulating film is made of a silicon oxide film.

10. The semiconductor device according to claim 1, wherein a same kind of said impurity as contained in said insulating substrate is contained in said front-end insulating layer.

11. The semiconductor device according to claim 1, wherein said lower layer insulating film and said insulating substrate are different from each other in material.

12. The semiconductor device according to claim 1, wherein said upper layer insulating film, said lower layer insulating film and said insulating substrate are different from each other in material.

13. The semiconductor device according to claim 1, wherein said lower layer insulating film and said upper layer insulating film are different from each other in a rate of a decrease in impurity concentration.

14. A semiconductor device comprising:

a semiconductor layer formed on an insulating substrate with a front-end insulating layer being interposed between said semiconductor layer and said insulating substrate, said front-end insulating layer having a lower layer insulating film and an upper layer insulating film, wherein an impurity is contained in said front-end insulating layer so that a value obtained by dividing the impurity concentration at a surface of said front-end insulating layer contacting said semiconductor layer by the impurity concentration at a surface of said insulating substrate contacting said front-end insulating layer is equivalent to a decreasing rate being about $\frac{1}{1000}$-fold or less per 1 nm.

15. The semiconductor device according to claim 14, wherein said lower layer insulating film and said insulating substrate are different from each other in material.

16. The semiconductor device according to claim 14, wherein said upper layer insulating film, said lower layer insulating film and said insulating substrate are different from each other in material.

17. The semiconductor device according to claim 14, wherein said lower layer insulating film and said upper layer insulating film are different from each other in a rate of a decrease in impurity concentration.

* * * * *